United States Patent
Tseng et al.

(10) Patent No.: US 7,180,227 B2
(45) Date of Patent: Feb. 20, 2007

(54) PIEZOELECTRIC O-RING TRANSDUCER

(75) Inventors: Ming-Hung Tseng, Miaoli (TW); Chin-Chih Chen, Hsinchu (TW); Tzu-Chan Wang, Kaohsiung (TW); Wei-Shin Tien, Kaohsiung (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 31 days.

(21) Appl. No.: 10/759,670

(22) Filed: Jan. 16, 2004

(65) Prior Publication Data

US 2005/0156487 A1   Jul. 21, 2005

(51) Int. Cl.
*H01L 41/053*   (2006.01)
*H01L 41/113*   (2006.01)

(52) U.S. Cl. .................. 310/340; 310/338; 310/339; 310/344; 310/369; 277/321; 277/433

(58) Field of Classification Search ........ 310/338–340, 310/344, 367, 369; 277/321, 433
See application file for complete search history.

(56) References Cited

U.S. PATENT DOCUMENTS

| | | | | |
|---|---|---|---|---|
| 3,230,402 A | * | 1/1966 | Nightingale et al. | ........ 310/338 |
| 3,638,053 A | * | 1/1972 | Schenk et al. | ............... 310/338 |
| 3,798,474 A | * | 3/1974 | Cassand et al. | ............. 310/331 |
| 4,585,970 A | * | 4/1986 | Koal et al. | .................... 310/331 |
| 4,629,925 A | * | 12/1986 | Booth et al. | ................ 310/330 |
| 5,159,228 A | * | 10/1992 | Schaetzle | .................... 310/338 |
| 5,341,062 A | * | 8/1994 | Cero et al. | ................... 310/339 |
| 5,540,448 A | * | 7/1996 | Heinzen | ..................... 277/321 |
| 5,560,278 A | * | 10/1996 | Lark | ........................... 92/5 R |
| 6,178,919 B1 | | 1/2001 | Li et al. | |
| 6,215,231 B1 | * | 4/2001 | Newnham et al. | .......... 310/371 |
| 6,436,241 B1 | * | 8/2002 | Persson et al. | ............. 162/371 |
| 2002/0113380 A1 | * | 8/2002 | Clark | ......................... 277/650 |

FOREIGN PATENT DOCUMENTS

JP    57-210022    * 12/1982

* cited by examiner

*Primary Examiner*—Thomas M. Dougherty

(57) ABSTRACT

An o-ring sealing device, molded with an imbedded piezoelectric element, for use in vacuum systems. The imbedded element, of a circumferential length, has an oblong cross-sectional shape, the oblong shape having a pair of ends for externally connecting to a signal processor. The piezoelectric element is concentrically disposed and centrally placed within a mold cavity of a predetermined diameter. The cavity is filled with an elastic material fully encapsulating and insulating the piezoelectric element.

21 Claims, 3 Drawing Sheets

$q = [I]x_i F_q$

PIEZOELECTRIC O-RING TRANSDUCER

BACKGROUND OF THE INVENTION

1. Technical Field

This invention relates to the field of very high and ultra high vacuum systems, for example, vacuum systems used in semiconductor manufacturing. More specifically, the invention pertains to the field of vacuum seals and methods to detect seal damage.

2. Description of the Prior Art

A number of processes are used for depositing or removing thin film material from a semiconductor substrate. Typically, these processes occur in an etching or deposition chamber under a state of very high or ultra high vacuum. The chamber contains a highly reactive environment such as produced in a chemical deposition reaction between a carrier gas and a precursor, producing a solid reaction product.

In spite of rather large differences among various vacuum systems, all of them possess some elements in common. FIG. 1 shows a very high vacuum system device intended for operation in the $10^{-6}$ to $10^{-9}$ Torr pressure range. The actual lower limit of pressure which will be reached will depend on the choice and design of components as well as on the care taken in fabrication and cleaning. The major components involved in this system are; a process chamber 21, mechanical and diffusion pumps (not shown), piping 24, and seals 26. Other components not shown include vacuum gauges for assessing vacuum conditions, valves, baffle, cold trap and miscellaneous hardware including a getter ion pump, and protective devices, etc.

Ultra-high vacuum systems are used in many different applications involving semiconductor manufacturing, nuclear particle accelerators, and research apparatus. The manufacturing of VLSI (Very Large-Scale Integration) products, specifically sub-micron devices formed on 300 mm substrates, are extremely dependant on every process step, in particular, on the numerous processes using high and ultra-high vacuum chambers to fabricate sub-micron circuit lines. That is to say, seal reliability is of major concern since undetected seal damage may cause a high number of defective substrates before the processing problem is recognized.

SUMMARY OF THE INVENTION

The present invention is therefore intended to the above mentioned drawbacks.

Accordingly, the primary object of the present invention is to advance the state of the art of immediately identifying o-ring failure in reaction chambers.

It is another object of the present invention to indicate where a defective o-ring is located, thereby eliminating the otherwise lengthy trouble shooting process, thereby, and increasing system utilization.

It is yet another object of the present invention to provide a seal with its own detection system that is made from materials that will perform reliably despite the highly corrosive environment that is typical in reaction chambers.

This invention provides a seal design that integrates a piezoelectric transducer with an o-ring for sensing change in seal performance. For example, when o-rings are used for sealing off reaction chambers from atmospheric pressures during a process requiring very high or ultra-high vacuum pressures, any leakage that may result from an o-ring failing will be detected and an alarm signal provided to a process controller. The process may be aborted immediately.

In a conventional setting, when a product is being processed with a damaged seal in a corrosive and reactive environment, the product being processed would be irreparably flawed, producing a very high defect count. The only recourse upon discovering these defects is to shut down the process and begin the costly and time-consuming troubleshooting procedure. Backtrack inspection is necessary to learn how many previous production runs were involved, perhaps scrapping all of them. The next order of action would be to identify the cause. When a particular seal is identified, the seal is changed and the process re-qualified.

Current semiconductor deposition and etching processes demand more up time, less maintenance, while increasing product yield through better process monitoring. An improvement offered by the present invention provides an o-ring seal that is effective for increasing machine utilization and significantly reducing or even eliminating time spent on debug and qualification. When a product is processed in a corrosive and reactive environment, under low pressures, the seals that protect the product must perform unconditionally.

Therefore, and according to a preferred aspect of the present invention, there is provided a piezoelectric transducer packaged within an o-ring seal for detecting variation of a mechanical compressive force.

These and other objects and advantages of the invention will be apparent to those of skill in the art upon reference to the following detailed description, which description makes reference to the drawing.

DETAILED DESCRIPTION OF THE PREFERRED EMBODIMENT

Figure 1:
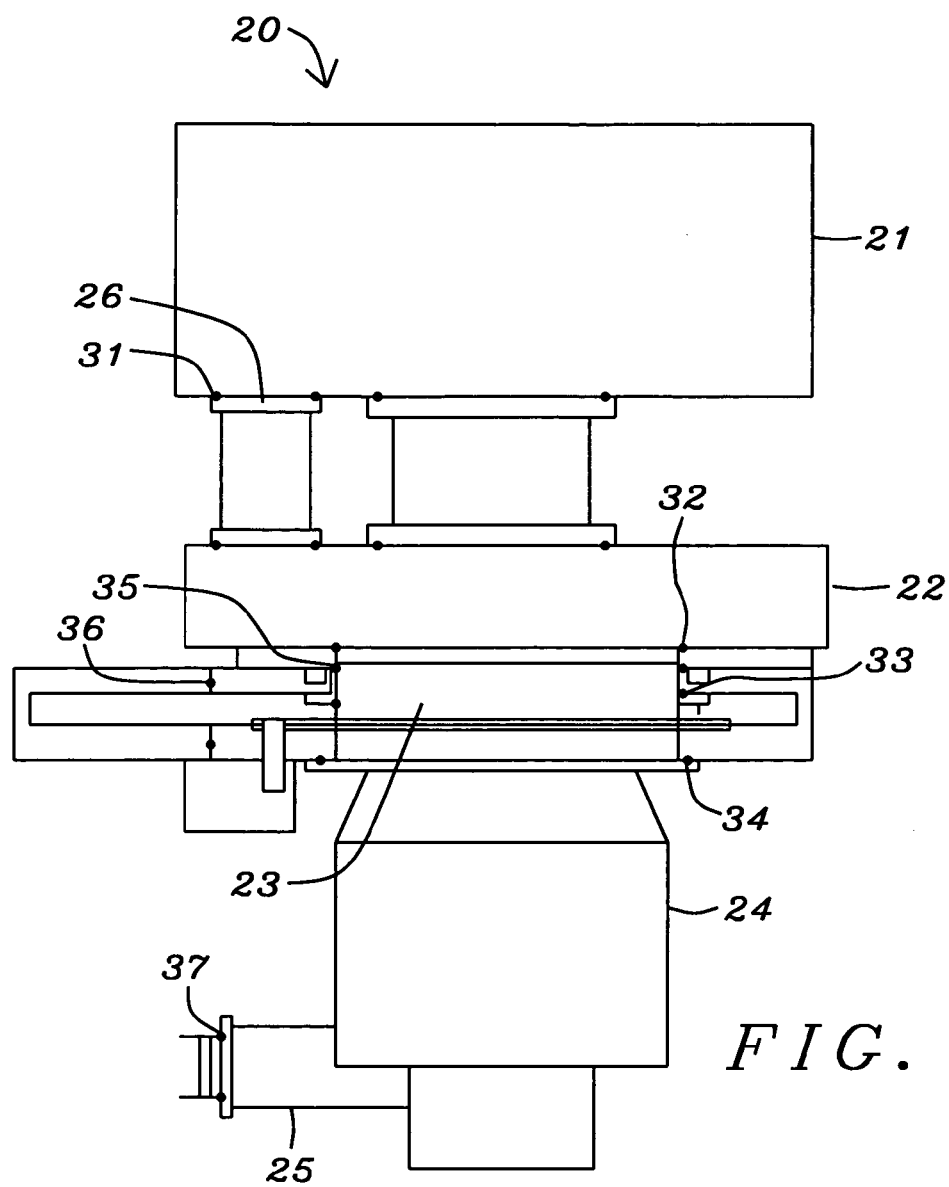
FIG. 1 shows a side view layout of a conventional vacuum system configuration used in very high and ultra high vacuum applications highlighting several of the many sealing surfaces.

FIG. 1 schematically illustrates a vacuum system 20 intended for operation in the $10^{-6}$ to $10^{-9}$ Torr pressure range. A process chamber 21 in which materials for a metal deposition process using titanium, titanium nitride, or aluminum copper alloys, etc. These processes are performed at low operating pressure (less than $10^{-6}$ Torr) to maximize film density and deposition rate.

Several of the major components involved in a system of this type include, a process chamber 21, an exhaust manifold 22, mechanical and diffusion pumps (not shown) communicating to fore line 25, a turbomolecular pump 24, and many flanged surfaces 26 with seals 31 between mechanically interlocked components. Several of the variety of seals that are used are of various diameters and cross-section size o-rings with a variety of names that consists of a bonnet seal 36, an o-ring seal 32 between an advanced process chamber 23 and the exhaust manifold 22, another o-ring seal 35 and a seal 33 for a lower gate housed within the advanced process chamber 23, and a seal 34 sandwiched between an upper flange surface of the turbomolecular pump 24 and an outside lower surface of the advanced process chamber 23. A fore-line seal 37 is used to seal the coupling of an interface line from the mechanical and diffusion pumps. Other components not shown include vacuum gauges for assessing vacuum conditions, valves, baffles, cold traps and miscellaneous hardware including a getter ion pump, and protective sealing devices, etc, many of which require sealing.

Low-pressure systems are used in many different applications including semiconductor manufacturing, nuclear particle accelerators, and research apparatus. The manufacturing of VLSI (Very Large-Scale Integration) products, specifically sub-micron devices formed on 300 mm substrates, are extremely dependant on every process step, in particular, on the numerous processes using ultra-high vacuum chambers to fabricate sub-micron circuit lines. That is to say, seal reliability is of major concern since undetected seal damage may cause a high number of defects before the problem can be identified.

Figure 2:
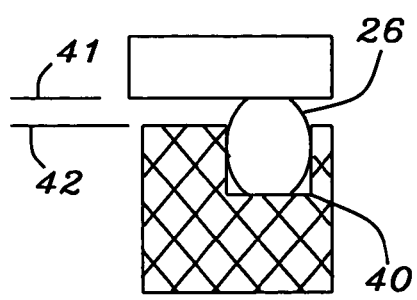
FIG. 2 illustrates a typical o-ring groove with an o-ring inserted.
Figure 3:
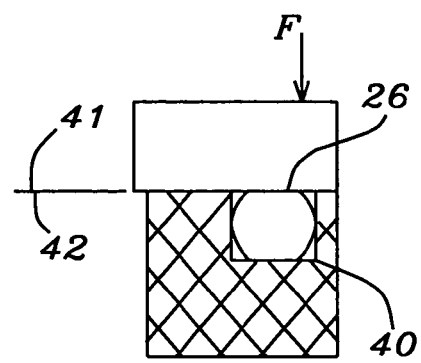
FIG. 3 illustrates an o-ring clamped for sealing.
Figure 4:
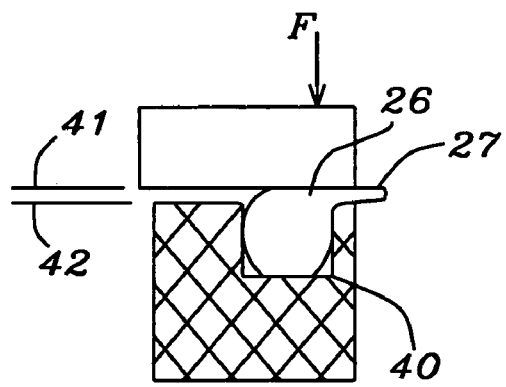
FIG. 4 shows a pinched and defective seal.

FIGS. 2, 3 and 4 illustrate conventional sealing between two surfaces 41 and 42. FIG. 2 shows a cross-section of an elliptical shaped o-ring 26 placed in groove 40. FIG. 3 illustrates the upper surface 41 urged against surface 42 while compressing o-ring 26. FIG. 4 illustrates an o-ring 26 that is shown crimped 27 between surfaces 41 and 42. This condition may occur during a process cycle, consequently, rendering substrates to a high defect count because of leakage due to o-ring damage.

The present invention senses and provides a signal indicating an o-ring failure during low-pressure processes. Imbedding a piezoelectric material within an o-ring in order to measure a change in o-ring performance during low-pressure processes is a novel, but more importantly, a much-needed sealing device for the semiconductor industry. The imbedded piezoelectric element generates an electric potential difference when compressed, twisted, or distorted. This provides a convenient transducer effect between electrical and mechanical fluctuations. Quartz demonstrates this property and is extraordinarily stable. Quartz elements are used for watch crystals and for precise frequency reference crystals for radio transmitters. Rochelle salt produces a comparatively large voltage upon compression and was used in early audio applications. Barium titanate, lead zirconate and lead titanate is ceramic materials, which exhibit piezoelectricity and are used in sound as well as microphones. For example, when a piezoelectric element is imbedded within an o-ring used for sealing off reaction chambers from atmospheric pressures, any leakage that may result from an o-ring failing will be detected and a signal provided to a process controller. The process may be aborted if detected early in the operation. The advantages of early detection would preclude product waste, shorten maintenance and debug time, and increase machine utilization.

Piezoelectric transducers operate on the principle that when an asymmetrical crystal lattice is distorted, there will be a charge reorientation resulting in a net charge on two surfaces.

Figure 5:
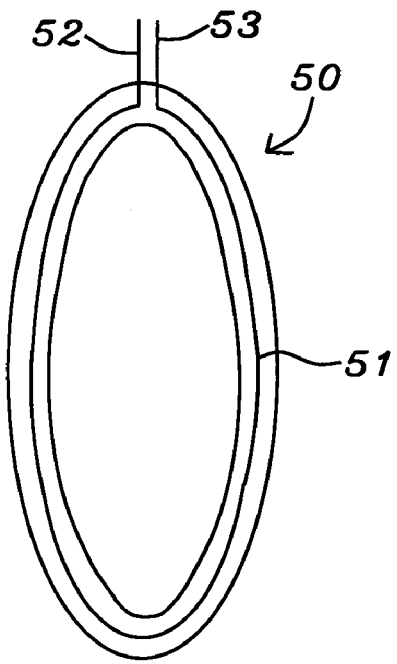
FIG. 5 illustrates an o-ring device of the invention.
Figure 6:
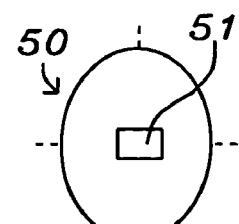
FIG. 6 shows a cross-sectional view of an o-ring device of the invention.
Figure 7:
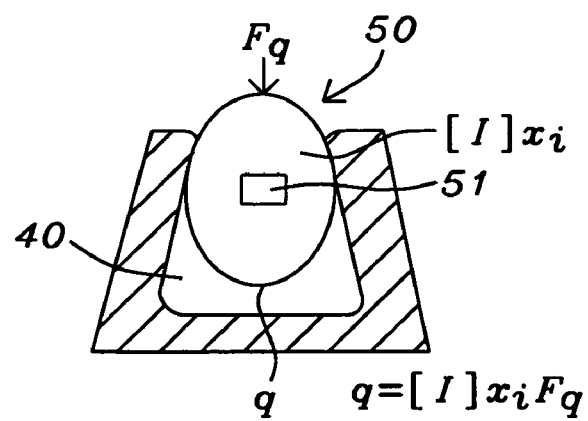
FIG. 7 shows an o-ring groove with an o-ring device, of the invention, inserted.

Referring now to FIGS. 5–7, consider such a piezoelectric element 51 embedded within an o-ring 50 having conducting charge collectors 52 and 53 attached to each side as illustrated in FIG. 5. FIG. 6 show a view of a cross-section of the o-ring 50 and the embedded element 51.

FIG. 7 gives the resulting operation in a free-body diagram showing "q" as the generated voltage that is proportional to the amount of applied force $F_q$:

$$q=[I]X_iF_q$$

where $[I]X_i$ is the piezoelectric constant.

With proper construction, piezoelectric elements can be made sensitive to compression, shear, bending, or twisting. It must be noted that a piezoelectric sealing device actually produces a charge as the result of this type of physical deformation.

Figure 8:
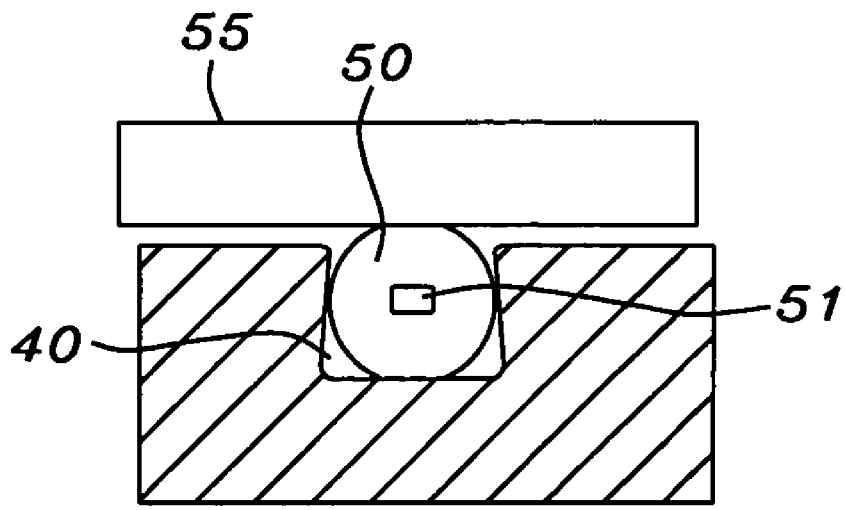
FIG. 8 shows an o-ring device, of the invention, unclamped.
Figure 9:
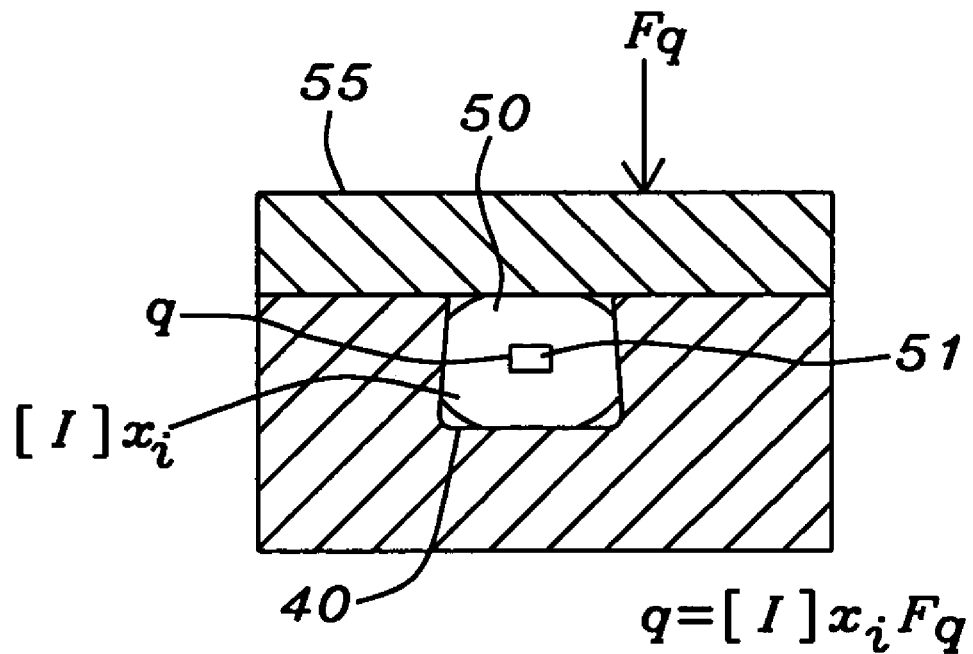
FIG. 9 shows a schematic response to a clamped o-ring device, of the invention.

FIGS. 8 and 9 illustrate an application of the invention. FIG. 8 shows a cross-section of a piezoelectric o-ring 50 having an imbedded oblong shaped element 51. The o-ring is placed within a standard o-ring groove 40. Upper cover 55 rests on the top surface of the o-ring. FIG. 9 shows the piezoelectric o-ring 50 compressed within o-ring groove 40 by applied force ($F_q$) acting on the upper cover 55. Any change in compression during the process is detectable by a proportional change in voltage (q). This novel o-ring application provides detection sensitivity for discriminating of any changes between the initial compressive force and any change in the compression force during the process cycle.

In summary, the most common type of seal used for sealing vacuum systems is the o-ring. Disclosed is an o-ring sealing device of the invention. The o-ring device has a molded piezoelectric element of a predetermined circumferential length with an oblong cross-sectional shape. The cross-sectional shape has a pair of conducting charge collectors, each with two ends; one pair connectively attached to opposite sides of the oblong shape, the other pair is connected to a signal processor. The piezoelectric element is concentrically disposed and centrally placed within a mold cavity of a predetermined diameter. The mold cavity is filled with an elastic material encapsulating and insulating the piezoelectric element therein. The piezoelectric element is selected from the group consisting of quartz, rochelle salt, barium titanate, lead zirconate, and lead titanate, while the elastic material is selected from the group consisting of all rubber compounds used for sealing applications.

The conducting charge collector attached on opposite sides of the oblong cross-section is used to provide a reading of seal compression while providing real-time monitoring of o-ring performance during ultra-high vacuum operations and eliminating lengthy maintenance problem-solving studies.

While the invention has been particularly shown and described with reference to the preferred embodiments thereof, it will be understood by those skilled in the art that various changes in form and details may be made without departing from the spirit and scope of the invention.

What is claimed is:

1. An o-ring monitoring device for a vacuum system comprising:
   a piezoelectric element with a pair of ends for externally connecting to a signal processor;
   said piezoelectric element disposed and placed to be fully insulated within a mold cavity, said mold cavity having a predetermined diameter and cross-section shape;
   said mold cavity filled with an elastic material encapsulating said piezoelectric element therein.

2. The monitoring device of claim 1, wherein a voltage "q" is generated as feedback to said signal processor, said voltage "q" is proportional to the amount of applied force "$F_q$", and is given as:

$$q=[I]X_iF_q$$

where $[i]X_i$ is the piezoelectric constant.

3. The monitoring device of claim 1 wherein said piezoelectric element is selected from the group consisting of quartz, rochelle salt, barium titanate, lead zirconate, and lead titanate.

4. The monitoring device of claim 1 wherein said elastic material is selected from the group consisting of all rubber compounds used for sealing applications.

5. The sealing device of claim 1 wherein said piezoelectric element has an oblong cross section and a plurality of conducting charge collectors attached on opposite sides of said oblong cross-section to provide a reading of seal compression.

6. The sealing device of claim 1 wherein circumferentially encapsulating said piezoelectric element within an o-ring provides real-time monitoring of o-ring performance during ultra-high vacuum operations.

7. The sealing device of claim 6 wherein said real-time monitoring of o-ring performance eliminates lengthy maintenance problem-solving studies, most importantly, early detection precludes product waste, shortens debug time, and increases machine utilization.

8. The sealing device of claim 6 wherein said real-time monitoring of an o-ring performance eliminates back-tracking to find product defects caused by undetected o-ring failure.

9. A vacuum system comprising an o-ring sealing device, said o-ring sealing device having a piezoelectric element molded therein;
said piezoelectric element having a pair of lead wires that egress from an outer and side periphery of said o-ring;
said o-ring sealing device placed in an o-ring groove and compressed between two surfaces;
said pair of lead wires connected to a signal processor.

10. The vacuum system according to claim 9 wherein said compression is between two flanged surfaces and generates and provides a feedback voltage value "q" to said signal processor, said feedback voltage is proportional to the amount of compressive force "$F_q$", and is given as;

$$q=[I]X_iF_q$$

where $[I]X_i$ is the piezoelectric constant.

11. The vacuum system according to claim 10, wherein "q" stabilizes after a desired vacuum level is reached, and any variance thereafter signifies a change in compressive force "Fq", indicating a warning of a potential leak or of a defective o-ring.

12. The vacuum system according to claim 9, wherein a plurality of o-ring sealing devices used in a vacuum system simplifies maintenance debug by immediately indicating the position of a defective o-ring by providing a feedback signal indicating a specific o-ring failure during the vacuum process.

13. The vacuum system according to claim 12, wherein said plurality of o-ring sealing devices used in a vacuum system eliminates the otherwise time consuming search for a defective seal which causes a high number of defects before it is identified as being defective.

14. A method for monitoring compression stability of an o-ring seal during vacuum operations, comprising the steps of:
providing an o-ring seal with a piezoelectric element encapsulated therein, said piezoelectric element with a pair of ends for externally connecting to a signal processor, the providing step including:
placing said piezoelectric element within a mold cavity of a predetermined diameter and cross-section shape;
filling said mold cavity with an elastic material for molding said o-ring having a fully encapsulated and insulated piezoelectric element; and
curing said molded o-ring, and
placing said molded o-ring with an encapsulated piezoelectric element in an o-ring groove for sealing a vacuum chamber;
connecting said pair of ends to a signal processor for monitoring compression stability of said o-ring.

15. The method of claim 14 wherein a voltage "q" is generated as feedback to said signal processor, said voltage "q" is proportional to the amount of applied force "$F_q$", and said voltage "q" is given as;

$$q=[I]X_iF_q$$

where $[I]X_i$ is the piezoelectric constant.

16. The method of claim 14 wherein said piezoelectric element is selected from the group consisting of quartz, rochelle salt, barium titanate, lead zirconate, and lead titanate.

17. The method of claim 14 wherein said elastic material is selected from the group consisting of all rubber compounds used for sealing applications.

18. The method of claim 14 wherein said piezoelectric element comprises a pair of conducting charge collectors attached on opposite sides of an oblong cross-sectional shape, and said conducting charge collectors are used to provide an output value of seal compression.

19. The method of claim 14 wherein said piezoelectric element that is encapsulated within an o-ring provides real-time monitoring of an o-ring's performance during vacuum operations.

20. The method of claim 19 wherein said real-time monitoring to determine o-ring performance eliminates lengthy problem-solving studies while early detection precludes product waste, shortens debug time and increases machine utilization.

21. The method of claim 19 wherein said real-time monitoring for o-ring performance eliminates back-tracking to find product defects caused by undetected o-ring failure.

* * * * *